United States Patent [19]

Shulenberger et al.

[11] Patent Number: 4,637,713
[45] Date of Patent: Jan. 20, 1987

[54] PELLICLE MOUNTING APPARATUS

[75] Inventors: Arthur M. Shulenberger; John A. Piatt, both of Capitola, Calif.

[73] Assignee: SCSS Instruments, Inc., Santa Cruz, Calif.

[21] Appl. No.: 781,227

[22] Filed: Sep. 27, 1985

[51] Int. Cl.[4] .................... G03B 27/62; G03B 27/64; G03F 9/00
[52] U.S. Cl. ..................... 355/76; 156/556; 355/125; 355/133; 430/5; 430/961
[58] Field of Search ............. 355/44, 45, 75, 76, 355/125, 133; 430/5, 961; 428/908.8; 156/379.8, 556, 559, 580

[56] References Cited

U.S. PATENT DOCUMENTS

| | | | |
|---|---|---|---|
| 3,811,893 | 5/1974 | Jannssen et al. | 355/125 X |
| 4,063,812 | 12/1977 | Abraham et al. | 430/5 X |
| 4,093,378 | 6/1978 | Horr et al. | 355/76 |
| 4,334,472 | 6/1982 | Back et al. | 355/76 X |
| 4,390,273 | 6/1983 | Loebach et al. | 355/125 |
| 4,423,954 | 1/1984 | Curti | 355/76 X |
| 4,548,493 | 10/1985 | Mayfield | 355/125 |

OTHER PUBLICATIONS

IBM Technical Disclosure Bulletin, "Package Mask for Photolithography", G. G. Via, vol. 18, No. 10, Mar. 1976, pp. 3360-3361.

Primary Examiner—Richard A. Wintercorn

[57] ABSTRACT

A pellicle mounting apparatus characterized by a pair of pellicle holder assemblies positioned on either side of a photomask holder assembly. A drive mechanism is coupled between the two pellicle holder assemblies to exert a simultaneous force on the two assemblies to drive them towards or away from the photomask holder assembly. An alignment assembly including a pair of telescopes are first aligned with pellicle holder assemblies, and then the photomask is adjusted to align it with the telescopes. Once the pellicle holder assemblies and photomask holder assembly are properly aligned, pellicles can be repeatedly and accurately attached to opposing sides of a series of photomasks.

10 Claims, 10 Drawing Figures

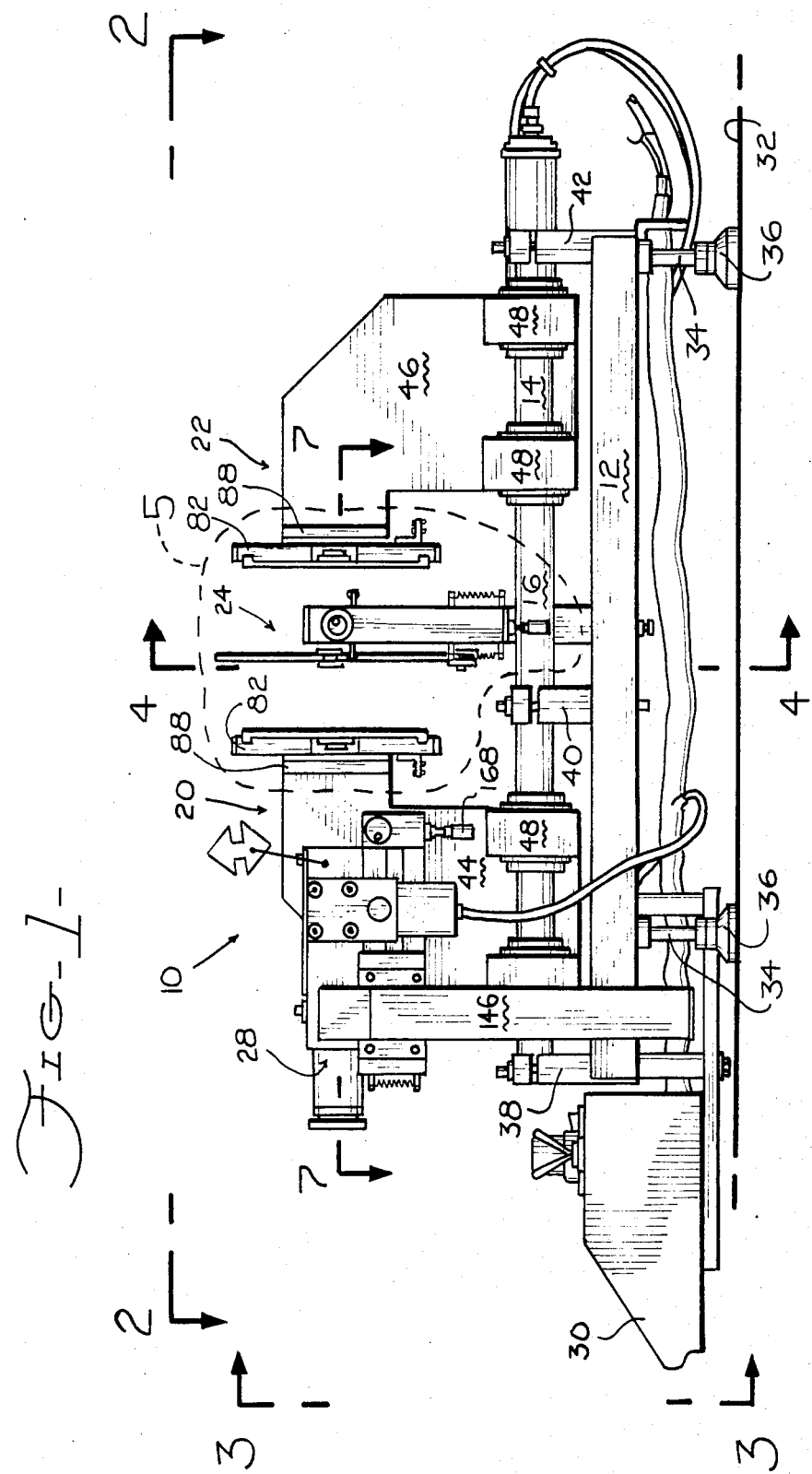

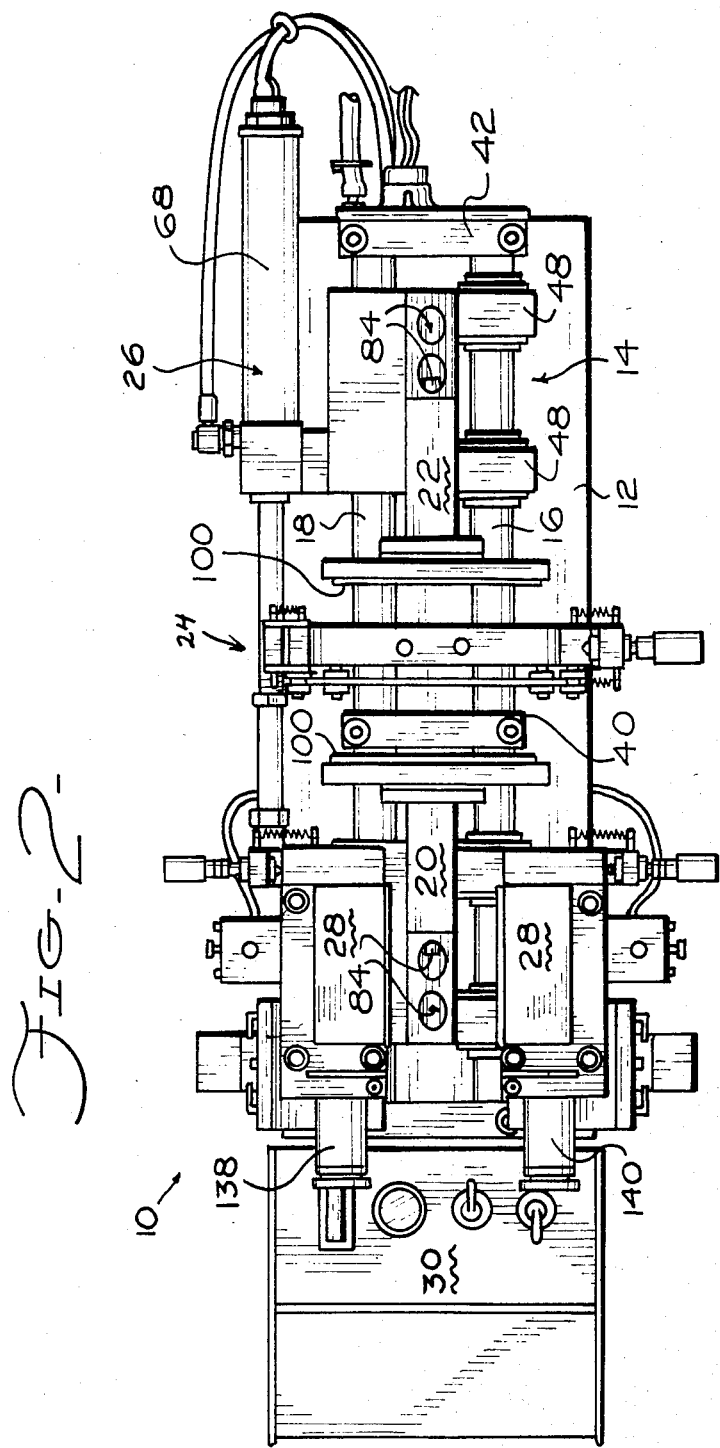

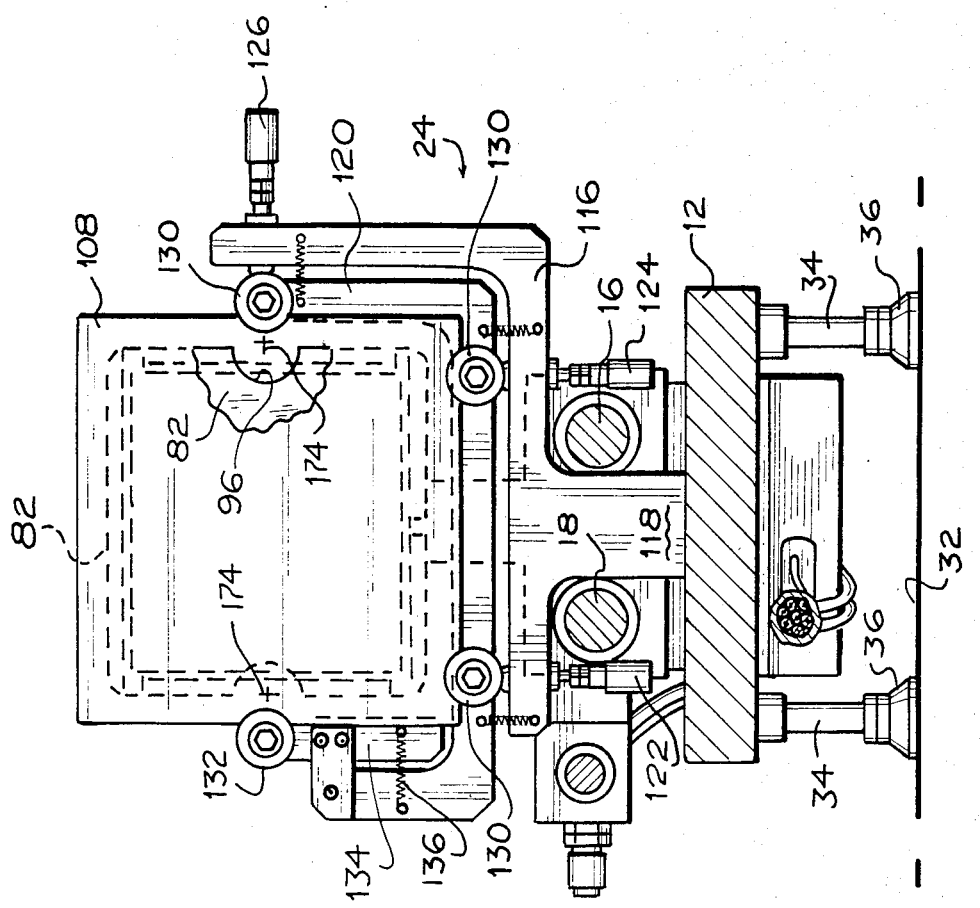
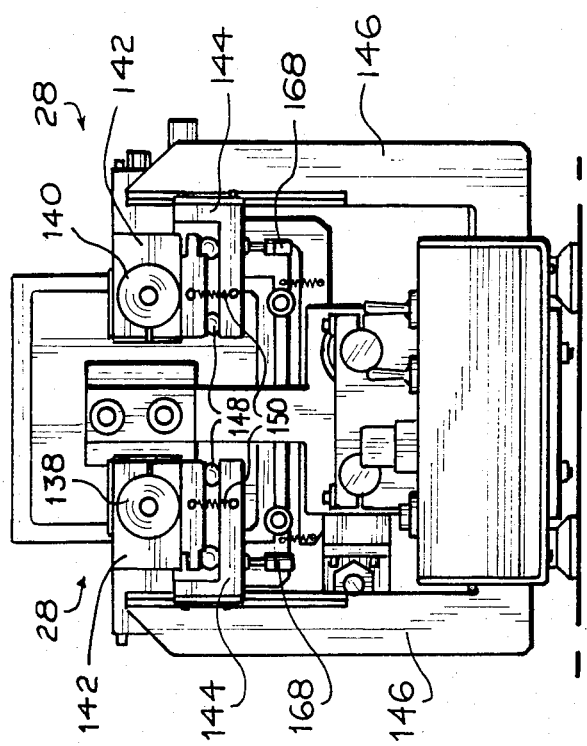

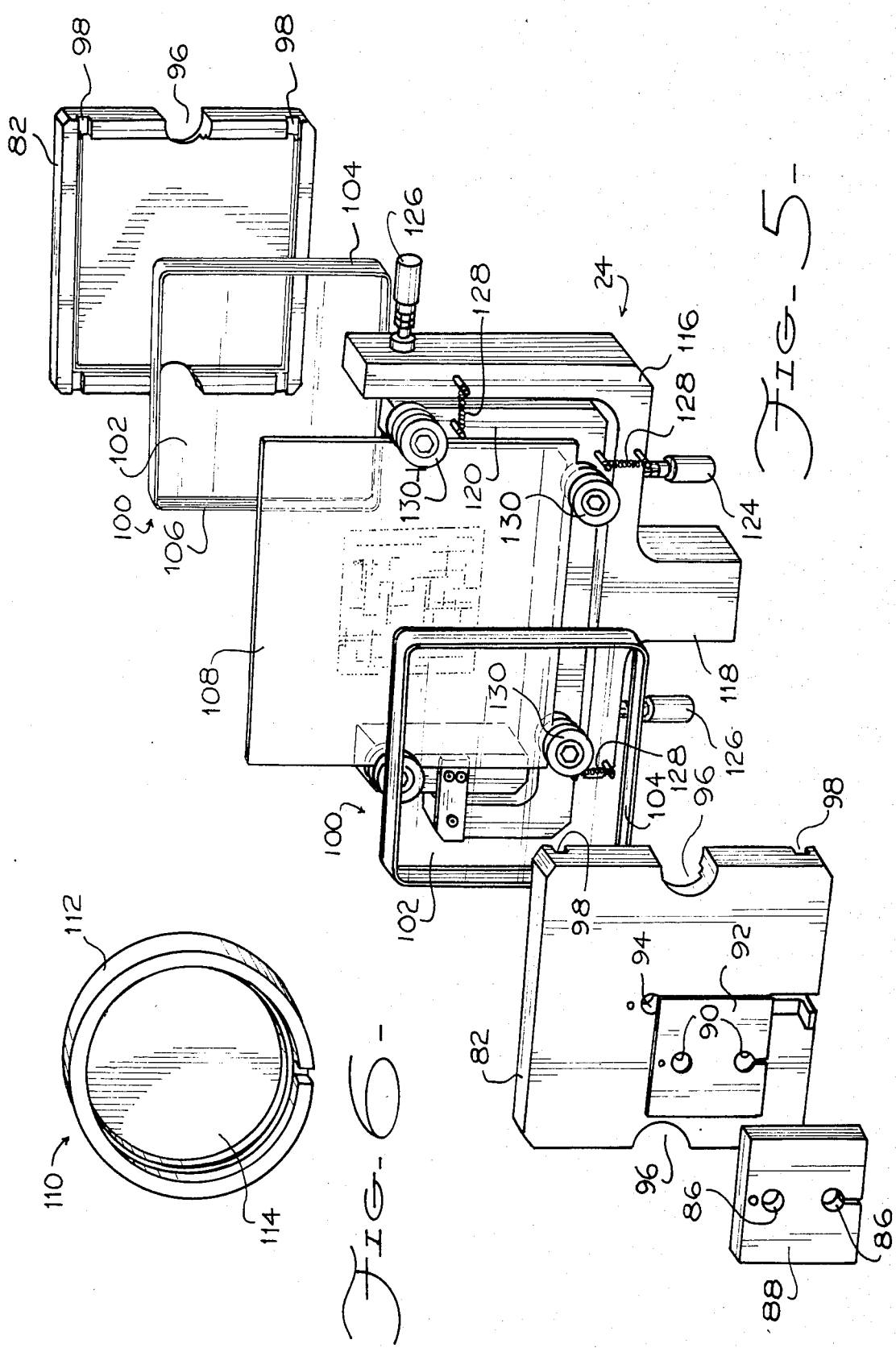

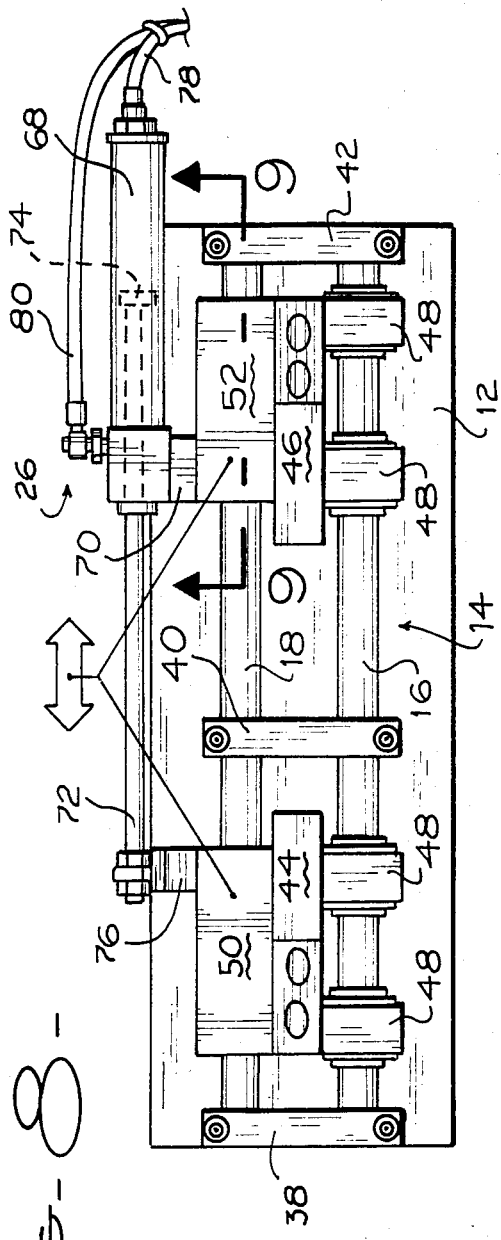
FIG-8-
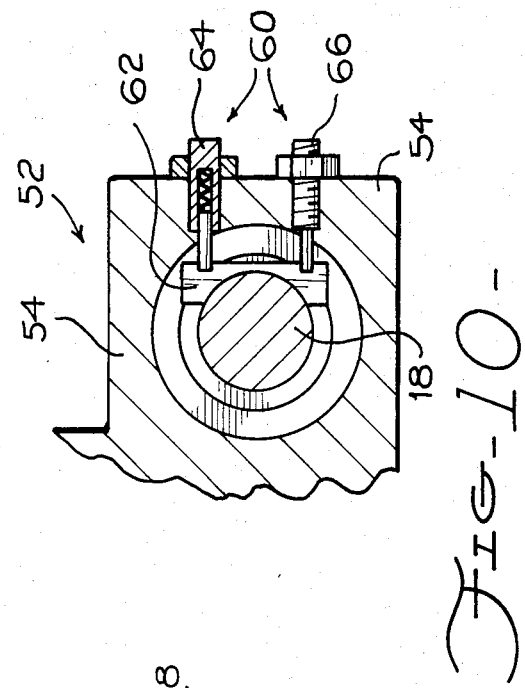
FIG-10-
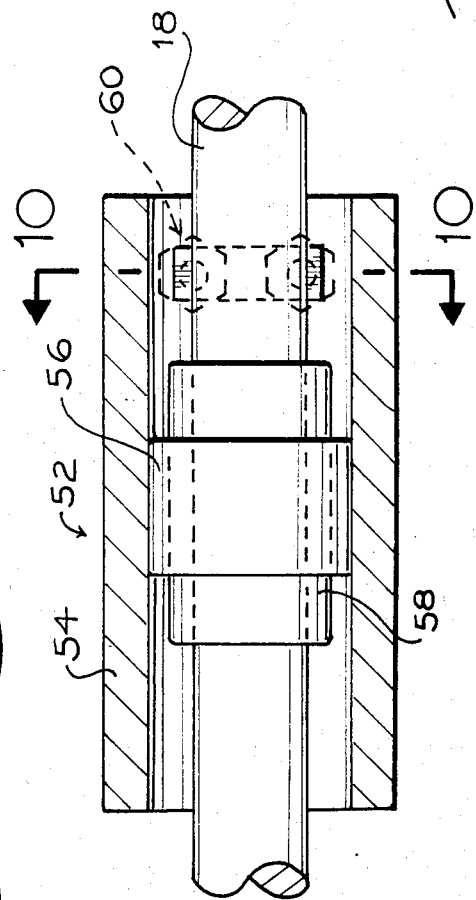
FIG-9-

PELLICLE MOUNTING APPARATUS

BACKGROUND OF THE INVENTION

1. Field of the Invention

This invention relates generally to apparatus used in the manufacture of integrated circuits and more particularly to devices used to apply a pellicle to an integrated circuit photomask.

2. Description of the Prior Art

To produce integrated circuits, thin, polished, disk shaped wafers of semiconducting material (such as silicon) are coated with a photoresist material. The wafers are then exposed to light through an integrated circuit photomask, developed, and further processed.

Typically, a series of photomasks are used to produce the various layers of the integrated circuit. It is necessary that each photomask be properly positioned with the wafer so that the successive layers are properly aligned.

As integrated circuits proceeded from small scale integration (SSI), to medium scale integration (MSI), large scale integration (LSI), and very large scale integration (VLSI) the need for proper alignment of the photomasks with the wafers became ever greater. Also, as the density of the circuitry of the integrated circuit increased, it became increasing critical to keep the photomasks absolutely clean. By way of example, a single dust mote on the surface of a photomask can ruin the integrated circuit being developed on the wafer below it.

To combat these problems, the industry developed pellicles to protect surfaces of the photomask. These pellicles include a thin, transparent membrane stretched across a frame. The frame serves to hold the membrane rigid, and spaces the membrane from the surface of the photomask. A sticky adhesive is used to bond the frame to a surface of the photomask. Sometimes the pellicle is only attached to a front surface of the photomask (which is usually the most critical surface), but quite often pellicles are attached to both sides of the photomask.

If the pellicles are properly attached to the photomasks, they can be useful in providing proper alignment between successive photomask exposures. Also, the pellicles keep dust, oils, etc. off of the surface of the photomask, which greatly reduces the chance for contaminating the photomask. Since the membrane of the pellicle is separated from the surface of the photomask by the thickness of the pellicle frame, any dust or other contamination of the surface of the membrane will be out-of-focus relative the surface of the photomask, and thus will not ruin the exposure.

Great difficulties have been encountered in properly attaching pellicles to a photomask. Traditionally, this job was done manually, or perhaps with the aid of simple hand tools and binocular microscopes. However, traditional techniques for attaching pellicles to photomasks have been more of an art than a science, and costly mistakes were inevitable.

SUMMARY OF THE INVENTION

The major object of this invention is to provide a pellicle mounting apparatus which quickly, easily, and accurately applies a pellicle to the surface of a photomask.

Another object of this invention is to provide a pellicle mounting apparatus which requires very little operator training.

Briefly, the invention includes a base, a pair of parallel, horizontal rails attached to the base, a photomask holder attached to the base near the middle of the rails, a first pellicle holder assembly slidably coupled to the rails on a first side of the photomask holder assembly, and a second pellicle holder assembly slidably coupled to the rails on the second side of the photomask holder assembly. A pneumatically powered cylinder and piston are attached between the first pellicle holder assembly and the second pellicle holder assembly to move them towards and away from the photomask holder.

The photomask holder assembly includes a three-point adjustment mechanism which adjusts the position of a photomask along a plane substantially perpendicular to the rails. The optical axes of a pair of a pair of telescopes are aligned with the first pellicle holder assembly, and then the three-point adjustment mechanism positions the photomask to align it with the optical axes of the telescopes. The second pellicle holder is in fixed alignment with the first pellicle holder.

An advantage of this invention is that once the photomask holder assembly is aligned with the pellicle holder assemblies, pellicles can be repeatedly and accurately attached to photomasks with very little chance of error.

Another advantage of this invention is that it requires much less skill and training to apply a pellicle to a photomask with the present invention than it did by prior art techniques.

These and other objects and advantages of the present invention will no doubt become apparent upon a reading of the following descriptions and a study of the several figures of the drawing.

BRIEF DESCRIPTION OF THE DRAWING

FIG. 1 is a side elevation of a pellicle mounting apparatus in accordance with present invention;

FIG. 2 is a top plan view taken along line 2—2 of FIG. 1;

FIG. 3 is a front elevation taken along line 3—3 of FIG. 1;

FIG. 4 is a cross section taken along line 4—4 of FIG. 1;

FIG. 5 is an exploded view of the portion of FIG. 1 encircled by line 5;

FIG. 6 illustrates an alternative configuration for a pellicle;

FIG. 8 is a top plan view of the base, rails, carriages, and pneumatic assembly of the present device;

FIG. 9 is a cross section taken along line 9—9 of FIG. 8; and

FIG. 10 is cross section taken along line 10—10 of FIG. 9.

DETAILED DESCRIPTION OF THE PREFERRED EMBODIMENT(S)

Figure 7:
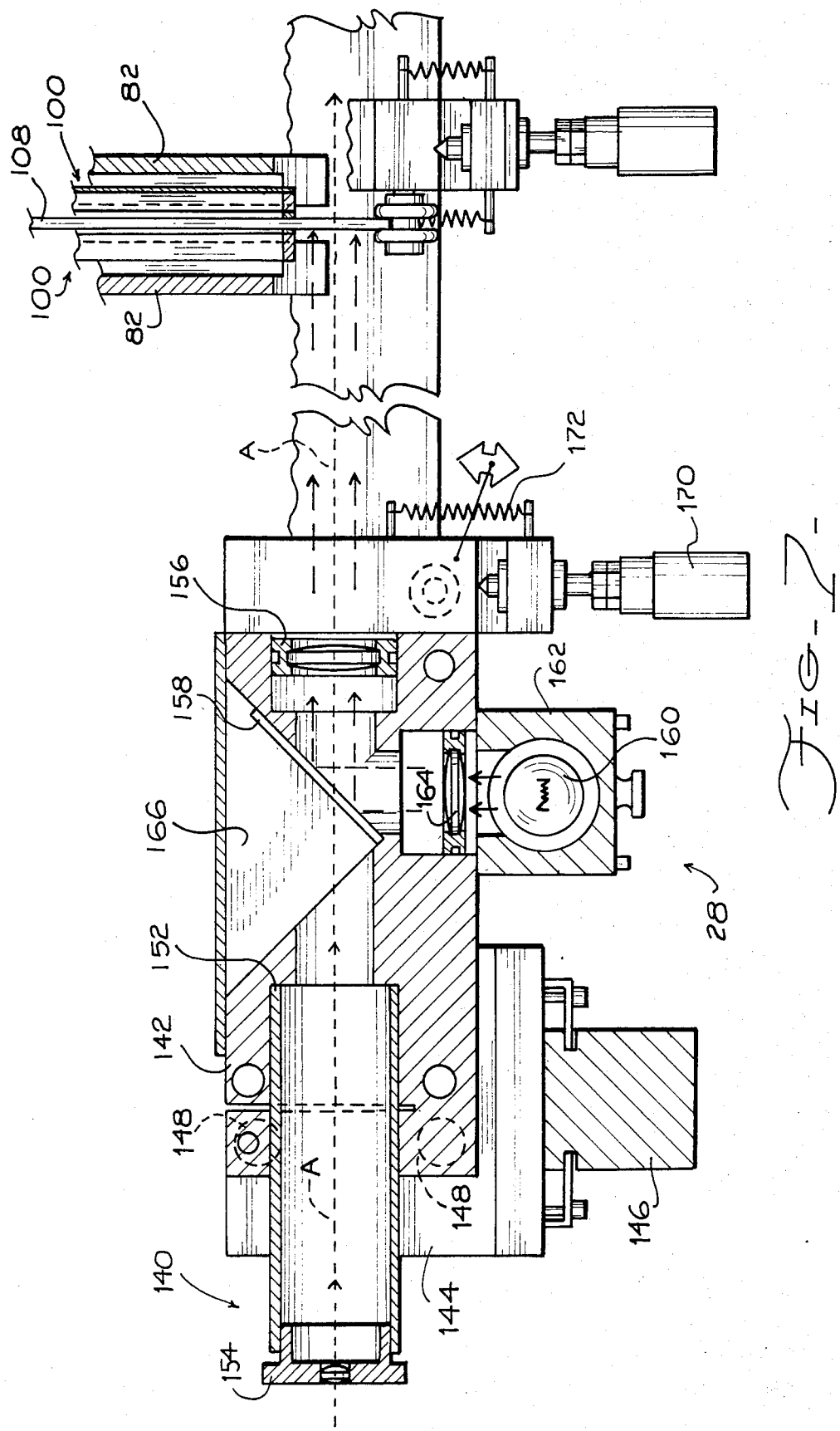
FIG. 7 is a cross section taken along line 7—7 of FIG. 1.

Referring to FIGS. 1 and 2, a pellicle mounting apparatus 10 in accordance with the present invention includes a base 12, a track 14 having a pair of rails 16 and 18, a first pellicle holder assembly 20, a second pellicle holder assembly 22, a photomask holder assembly 24, and a drive mechanism 26 coupled between first pellicle holder assembly 20 and second pellicle holder assembly 22. Apparatus 10 also includes an alignment assembly 28 and a control panel 30.

With reference to FIGS. 1, 2, 4, and 8, base 12 is a heavy, flat, elongated member which provides stability for the apparatus 10. Base 12 is supported above a surface 32 by adjustable legs 34 and feet 36.

As mentioned previously, track 14 includes a pair of elongated, cylindrical rails 16 and 18. Rails 16 and 18 are supported above the upper surface of base 12 by three brackets 38, 40, and 42. Rails 16 and 18 are preferably very smooth to minimize surface friction.

Referring more particularly to FIGS. 1, 2, and 8, pellicle holder assemblies 20 and 22 will be discussed in greater detail. In many respects, the two pellicle holder assemblies 20 and 22 are mirror images of each other, and like numerals will designate like components in the two assemblies.

Pellicle holder assemblies 20 and 22 include L shaped carriages 44 and 46, respectively, which are slidably attached to track 14. More particularly, carriages 44 and 46 are slidably coupled to rail 16 by relatively short linear bearings 48, and are coupled to rail 18 by elongated linear bearing assemblies 50 and 52.

Referring to FIG. 9, bearing 52 includes an outer housing 54, a support member 56, and a bearing member 58 supported coaxially within outer housing 54 by support member 56. A drag assembly 60 includes a brake pad 62, a spring biasing mechanism 64 which urges an end of brake pad 62 towards rail 18, and an adjustment screw 66 which adjusts the amount of pressure exerted by brake pad 62 against rail 18.

As will be discussed in greater detail subsequently, the purpose of drag assembly 60 is to produce a slight drag on the second pellicle holder assembly 22 so that it lags behind the movement of first pellicle holder assembly 20. It should be noted that linear bearing assembly 50 is of similar construction to linear bearing assembly 52, except that linear bearing assembly 50 does not include the drag assembly 60.

Drive mechanism 26 includes a pneumatic cylinder 68 which is coupled to the housing 54 of linear bearing assembly 52 by a bracket 70. The drive mechanism 26 also includes an elongated shaft 72 which is coupled to a piston 74 (see FIG. 8) within the pneumatic cylinder 68. The free end of shaft 72 is coupled to linear bearing assembly 50 by a bracket 76.

Pneumatic hoses 78 and 80 are attached to opposing ends of cylinder 68. The pressurization of hoses 78 and 80 cause shaft 72 to move out from and into, respectively, pneumatic cylinder 68.

Since drive mechanism 26 is coupled between the first pellicle holder assembly 20 and the second pellicle holder assembly 22, under ideal (i.e. frictionless) conditions the activation of drive mechanism 26 would cause the pellicle holder assemblies to move towards and away from each other simultaneously. Since near ideal conditions are difficult to obtain, the drag assembly 60 is provided on second pellicle holder assembly 22 to ensure that first pellicle holder assembly 20 moves first. The reason that first pellicle holder assembly is caused to move towards and away from the photomask holder assembly 24 before the second pellicle holder assembly is that the application of the front pellicle to the photomask is usually more critical that the application of the back pellicle to the photomask.

Referring now to FIGS. 1, 2, and 5, pellicle holder assemblies 20 and 22 each include a holder member 82 which is coupled to the vertical end surfaces of carriages 44 and 46, respectively. The holder members 82 are coupled to the carriages 44/46 by bolts 84 which extend through holes 86 in a resilient member 88 and holes 90 in a washer 92 to engage holes 94 in the back of holder member 82. Since the resilient member 88 and washer 92 are substantially planar, the holder member 82 is held substantially vertically, i.e. substantially perpendicular to track 14. The purpose of resilient member 88 is to allow a certain degree of planar rotation of holder member 82 to ensure that the plane of a pellicle can coincide with the plane of a photomask.

Holder member 82 is substantially rectangular and is provided with a pair of viewing slots 96 for alignment purposes. Grooves 98 are provided on the inner surface of holder members 92 to firmly engage the frame of a pellicle.

Referring most particularly to FIG. 5, pellicles 100 include a transparent membrane 102 stretched tightly across a frame 104. An edge 106 of the frame 104 is provided with a sticky adhesive which permits the pellicle 100 to be attached to the photomask 108. The membrane 102 is separated from edge 106 by the thickness of frame 104.

Pellicles come in many shapes and sizes. While the pellicle 100 describe with reference to FIG. 5 is substantially square, another pellicle 110 is shown in FIG. 6 is round and includes an annular frame 112 across which the membrane 114 is stretched. In consequence, this invention provides for a number of shapes for holder member 82 to accommodate the various sizes and shapes of pellicles.

Referring now most particularly to FIGS. 4 and 5, the photomask holder assembly 24 will be discussed in greater detail. The photomask holder assembly 25 includes a yoke 116 having a leg 118 which extends between rails 16 and 18 to attach to base 12. The yoke 116 supports a frame 120 at three points, namely on the tip of three adjustment screws 122, 124, and 126. Frame 120 is retained on yoke 116 by a number of springs 128.

Attached to frame 120 are a number of sheaves 130 which support edges of photomask 108. A sheave 132 is connected to a pivotal arm 134, which is biased by a spring 136 towards another edge of photomask 108. Thus, a photomask 108 is supported at four points around its perimeter by the three sheaves sheaves 130 and and the pivotally mounted sheave 132.

The purpose of adjustment screws 122-126 is to provide an adjustment mechanism to vary the position of the photomask 108 along a plane substantially perpendicular to track 14. With reference to FIG. 4, rotation of adjustment screw 122 adjusts the height of the lower left corner of photomask 108, adjustment screw 124 adjusts the height of the lower right hand corner of photomask 108, and adjustment screw 126 adjusts the lateral position of photomask 108. It should be noted that adjustment screws 122-126 provide rather fine adjustments, and typically are not used to move the photomask 108 more than a few millimeters in a particular direction.

Referring to FIGS. 2 and 3, alignment assembly 28 includes a pair of telescopes 138 and 140. The telescopes are supported by housings 142 which sit upon platforms 144. The platforms 144 are slidably coupled to a pair of vertical arms 146 that are coupled at their lower ends to base 12. Platforms 144 are vertically adjustable to move the alignment assembly 28 up and down.

Housings 142 sit on a number of ball bearings 148 so that they can be moved around the upper surface of platforms 144. A number of springs 150 are provided to hold housings 142 on platforms 144.

Referring now to FIG. 7, the construction of telescope 140 and housing 142 will be discussed in greater detail. Telescope 140 includes a tube 152 which may slide within a bore provided in housing 140, an eyepiece 154, and a lens assembly 156. Telescope 140 has an optical axis A, and telescope 138 has a similar and parallel optical axis.

Disposed within housing 142 is a beam splitter 158 comprising a partially silvered mirror. The optical axis A of the telescope 140 extends through a central portion of beam splitter 158.

The alignment assembly 28 further includes a light bulb 160 located within an enclosure 162. When illuminated, light bulb 160 shines through a lens 164 and impinges on the surface of beam splitter 158. A portion of a light from light bulb 160 passes through beam splitter 158 into a light trap 166, and a portion of the light from light bulb 160 is reflected by the beam splitter 158 through lens assembly 156 as indicated at L. In consequence, a beam of light L emerges from lens assembly 156 which is substantially coaxial with optical axis A.

The focus of telescope 140 is adjusted by sliding tube 152 back or forth along optical axis A, and the focus of telescope 138 is adjusted similarly. The direction of optical axis A can be adjusted vertically by means of an adjustment screw 168 (see FIGS. 1 and 3), and laterally by an adjustment screw 170. As can be seen in FIG. 7, a spring 172 is used to bias housing 142 against the tip of adjustment screw 170, and a similar spring biasing mechanism is used to bias a lower surface of housing 142 against the tip of adjustment screw 168. Thus, both vertical and lateral adjustment of optical axis A can be accomplished by the use of adjustment screws 168 and 170, respectively.

The procedure for the use of apparatus 10 will be discussed with primary reference to FIGS. 1 and 7. The procedure breaks down into two parts, namely a setup procedure and an operational procedure.

The setup procedure involves the installation of the proper members 82 and photomask holder frame 120 for the particular photomask and pellicles to be used. The alignment assemblies 28 are then coarsely adjusted by moving platforms 144 up or down arms 146 until optical axis A is in approximately the correct position. A setup plate (not shown) is then placed in the holder member 82 of first pellicle holder assembly 20. The setup plate is similar in shape to a pellicle 100, but is provided with a pair of transparent ears having a cross-shaped fiducial which extends out from the member 82 along the optical axis A of telescopes 138 and 140. The telescopes 138 and 140 are provided with cross-hairs which are brought into alignment with the fiducials on the ears of the setup plate by rotating adjustment screws 168 and 170. Once the alignment assembly 128 is adjusted such that the optical axes are aligned with the fiducials of the setup plate, the setup plate is removed from holder member 82. It should be noted that by aligning the telescopes with first pellicle holder assembly 20 that they are automatically aligned with second pellicle holder assembly 22.

The operational procedure includes activating the drive mechanism 26 to separate the first pellicle holder assembly 20 from the second pellicle holder assembly 22. A pair of pellicles are prepared by peeling backing tape from the sticky surfaces of the frame, and are then placed on holder members 82. Next, a photomask is placed on photomask holder assembly 24, and adjustment screws 122-126 are rotated to align fiducials 174 (see FIG. 4) with the cross-hairs of telescopes 38 and 40. In this manner, the telescopes 138 and 140 are first aligned with pellicle holder assemblies 20 and 22 by means of the setup plate, and then the photomask 108 is aligned with the telescopes 138 and 140 to assuring that the pellicles 100 and photomask 108 are in perfect alignment. Once the fiducials on the photomask 108 have been aligned with the cross-hairs of telescopes 138 and 140, the drive mechanism 26 is activated to cause the pellicle holder assemblies 20 and 22 to move towards a photomask holder assembly 24. Because of the drag assembly 60 (see FIGS. 9 and 10) the first pellicle holder assembly 20 will move first until it lightly contacts the surface of photomask 108. Resilient member 88 allows the holder member 82 and thus pellicle 100 to pivot slightly to ensure that it makes a complete contact with photomask 108. Once the pellicle 100 contacts photomask 108, more drag is exerted on first pellicle holder assembly than on second holder assembly 22 and the second pellicle holder assembly 22 moves forwardly until its pellicle 100 contacts the rear surface of photomask 108. Once both pellicles 100 are engaged with opposing sides of photomask 108, they are firmly squeezed against the pellicle by the drive mechanism 26. The drive mechanism 26 is then reversed to move the pellicle holder assemblies 20 and 22 away from photomask holder assembly 24 so that the photomask 108 with the two pellicles 100 can be removed from photomask holder assembly 24.

It should be noted that, quite often, only a single pellicle will be attached to a photomask. In these case, only a single pellicle is engaged with a holder member 82. The process for applying a single pellicle is the same as described above.

While this invention has been described in terms of a few preferred embodiments, it is contemplated that persons reading the preceding descriptions and studying the drawing will realize various alterations, permutations and modifications thereof. It is therefore intended that the following appended claims be interpreted as including all such alterations, permutations and modifications as fall within the true spirit and scope of the present invention.

What is claimed is:

1. A pellicle mounting apparatus for mounting a pellicle to a photomask, said apparatus comprising:
    a base provided with a track;
    a photomask holder assembly coupled to said base;
    a first pellicle holder assembly coupled to said track on a first side of said photomask holder assembly;
    a second pellicle holder assembly coupled to said track on a second side of said photomask holder assembly; and
    drive means coupled between said first pellicle holder assembly and said second pellicle holder assembly, said drive means being adapted to drive said first pellicle holder assembly and said second pellicle holder assembly along said track towards and away from said photomask holder assembly.

2. A pellicle mounting apparatus as recited in claim 1 wherein said photomask holder assembly includes support means coupled to said base, and adjustment means coupled to said support means and adapted to adjust the position of a photomask along a plane substantially perpendicular to said track.

3. A pellicle mounting apparatus as recited in claim 2 further comprising first alignment means associated with said first pellicle holder assembly and second alignment means associated with said photomask holder, whereby said adjustment means can be used to move said photomask along said plane to bring said first alignment means and said second alignment means into alignment.

4. A pellicle mounting apparatus as recited in claim 3 wherein said first alignment means includes telescope means coupled to said base.

5. A pellicle mounting apparatus as recited in claim 4 wherein said telescope means is provided with a light source which is directed along an optical axis of said telescope means.

6. A pellicle mounting apparatus as recited in claim 1 wherein said first pellicle holder assembly and said second pellicle holder assembly each include support means slidably coupled to said track, and holder means attached to said support means and adapted to hold a pellicle in a plane which is substantially perpendicular to said track.

7. A pellicle mounting apparatus as recited in claim 6 where said first pellicle holder assembly and said second pellicle holder assembly each further include a resilient member disposed between said support means and said holder means, where said resilient member permits a pellicle held by said holder means to shift slightly from said plane.

8. A pellicle mounting apparatus as recited in claim 1 in which said drive means includes a fluid driven, piston-and-cylinder assembly, where said piston is coupled to one of said pellicle holder assemblies, and where said cylinder is coupled to the other one of said pellicle holder assemblies.

9. A pellicle mounting apparatus as recited in claim 8 further comprising a drag producing member attached to said second pellicle holder assembly.

10. A pellicle mounting apparatus as recited in claim 9 wherein said drag producing member includes braking means coupled between said second pellicle holder assembly and said track.

* * * * *